United States Patent
Sato et al.

(10) Patent No.: US 8,314,606 B2
(45) Date of Patent: Nov. 20, 2012

(54) CURRENT SENSING AND MEASURING METHOD AND APPARATUS

(75) Inventors: Tetsuo Sato, San Jose, CA (US);
Matsuura Nobuyoshi, Takasaki (JP);
Ryotaro Kudo, Takasaki (JP); Hideo Ishii, Takasaki (JP); Shin Chiba, Takasaki (JP)

(73) Assignee: Renesas Electronics America Inc., Santa Clara, CA (US)

( * ) Notice: Subject to any disclaimer, the term of this patent is extended or adjusted under 35 U.S.C. 154(b) by 341 days.

(21) Appl. No.: 12/620,438

(22) Filed: Nov. 17, 2009

(65) Prior Publication Data
US 2011/0115471 A1    May 19, 2011

(51) Int. Cl.
*G01R 19/00* (2006.01)
*G01R 31/26* (2006.01)

(52) U.S. Cl. ............ 324/123 R; 324/762.09; 324/762.01

(58) Field of Classification Search .. 324/762.01–762.1, 324/760.01–760.02, 750.01–750.3, 123 R, 324/76.11; 257/48; 438/14–18
See application file for complete search history.

(56) References Cited

U.S. PATENT DOCUMENTS

| | | | |
|---|---|---|---|
| 5,006,733 A * | 4/1991 | Brown | 327/553 |
| 5,966,024 A * | 10/1999 | Bui et al. | 324/750.3 |
| 6,160,441 A | 12/2000 | Stratakos et al. | |
| 6,362,798 B1 * | 3/2002 | Kimura et al. | 345/55 |
| 6,445,244 B1 | 9/2002 | Stratakos et al. | |
| 7,330,375 B2 * | 2/2008 | Daga et al. | 365/185.21 |
| 7,349,193 B2 * | 3/2008 | Cheever, Jr. | 361/155 |
| 7,408,388 B2 | 8/2008 | Nagasawa et al. | |
| 7,605,598 B2 * | 10/2009 | Kelly | 324/762.09 |

* cited by examiner

*Primary Examiner* — Tung X Nguyen
(74) *Attorney, Agent, or Firm* — Campbell Stephenson LLP

(57) ABSTRACT

A method can include obtaining a voltage across a first transistor as an obtained voltage. The method can also include multiplying the obtained voltage by a predetermined multiple M to yield a multiplied voltage. The method can further include applying the multiplied voltage to a second transistor, wherein the second transistor is N times smaller than the first transistor. The method can additionally include providing an output current of the second transistor as an M/N scaled estimate of an output current of the first transistor.

16 Claims, 10 Drawing Sheets

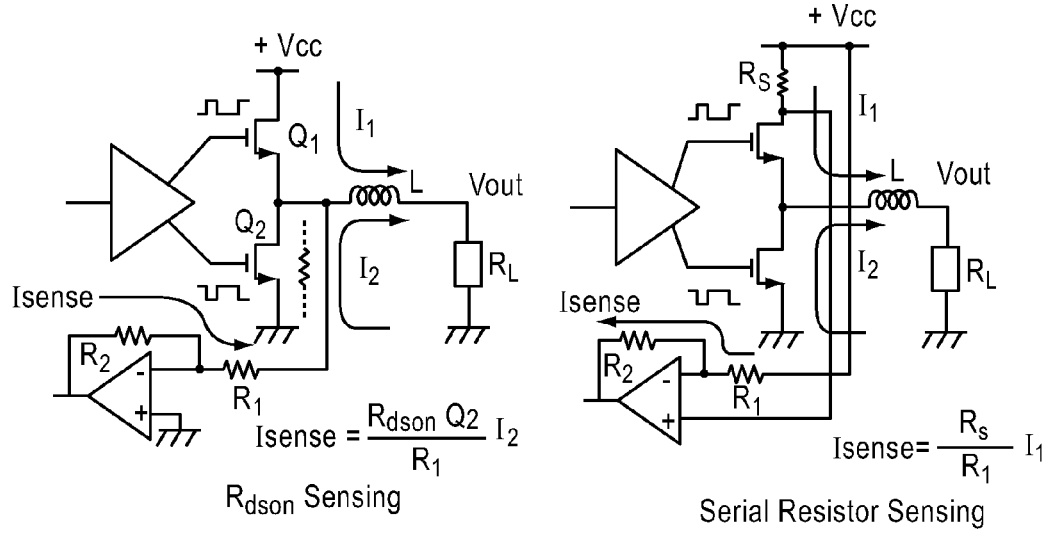
Fig.1 $R_{dson}$ Sensing
Fig.2 Serial Resistor Sensing
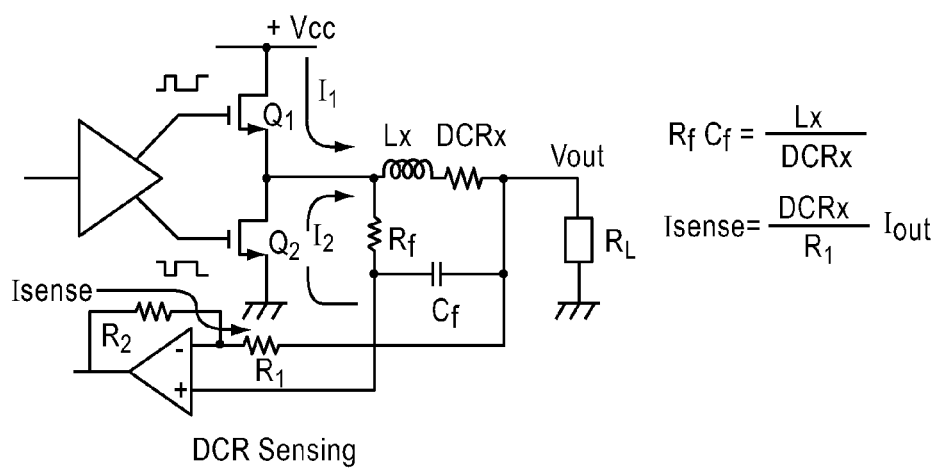
Fig.3 DCR Sensing Hi-Side TRS Current Sense Lo-Side TRS Current Sense

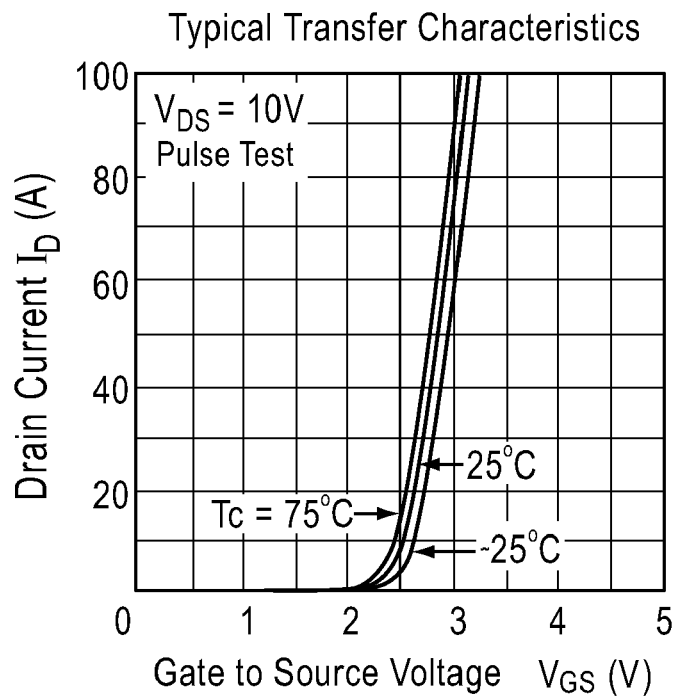
Fig.6  Typical TRS Characteristics -1
$V_{GS}$ vs $I_D$
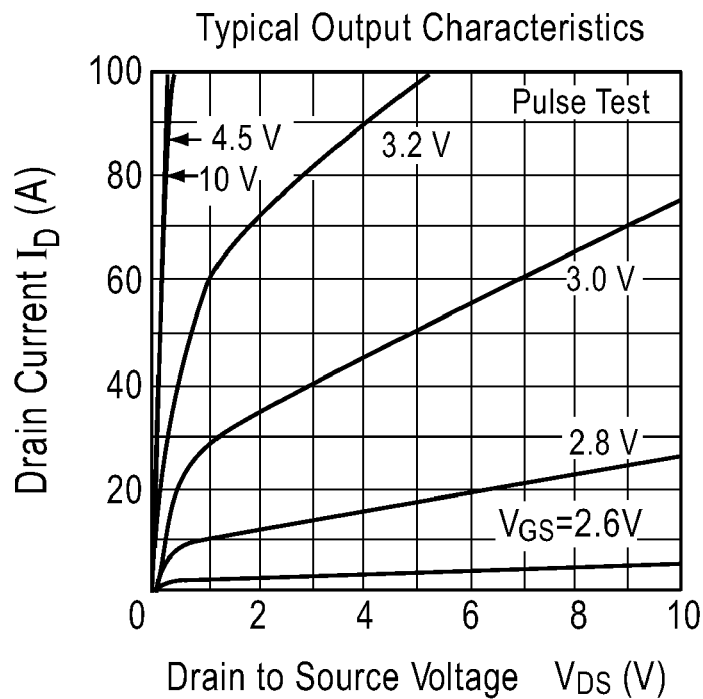
Fig.7  Typical TRS Characteristics - 2
$V_{DS}$ vs $I_D$

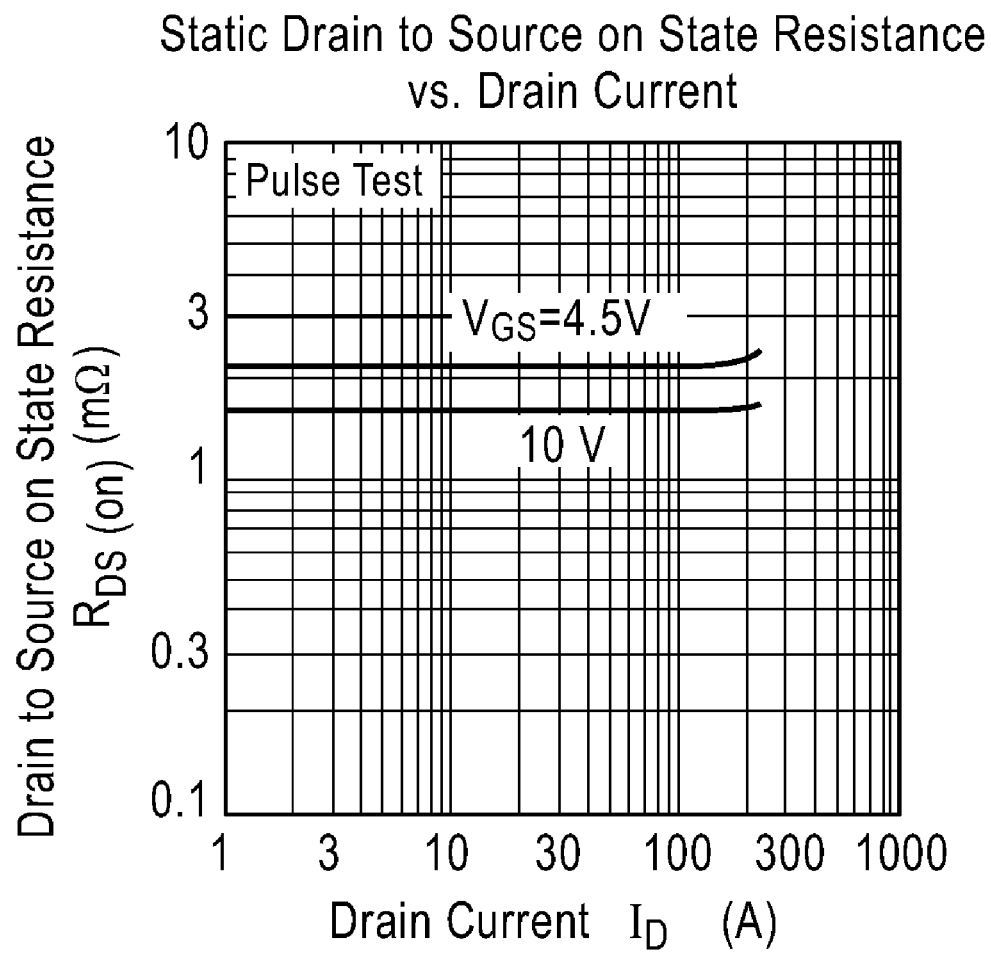
Fig.8  Typical TRS Characteristics - 3
Id vs Rdson (Saturation Condition)

Planar Vertical Structure

Voids in Drain Current Path

CURRENT SENSING AND MEASURING METHOD AND APPARATUS

BACKGROUND

1. Field

Certain embodiments of the present invention generally relate to the field of electronics. In particular, certain embodiments may be useful for providing current sensing.

2. Description of the Related Art

Current sensing is an area of interest for many applications. Traditionally, current sensing techniques for determining an output of a transistor relied either on measuring voltage and inferring current from a presumed effective resistance of a transistor, applying a serial resistance at a source of resistor, or measuring voltage across a serial inductance in the output path of the transistor. These techniques may be useful in certain situations, but may be unable to provide certain benefits that can be provided by various embodiments of the present invention.

SUMMARY

One embodiment of the present invention is a method. The method includes obtaining a voltage across a first transistor as an obtained voltage. The method also includes multiplying the obtained voltage by a predetermined multiple M to yield a multiplied voltage. The method further includes applying the multiplied voltage to a second transistor, wherein the second transistor is N times smaller than the first transistor. The method additionally includes providing an output current of the second transistor as an M/N scaled estimate of an output current of the first transistor.

Another embodiment of the present invention includes an apparatus. The apparatus includes a voltage amplifier configured to obtain a voltage across a first transistor as an obtained voltage and multiply the obtained voltage by a predetermined multiple M to yield a multiplied voltage. The apparatus also includes a second transistor, wherein the second transistor is N times smaller than the first transistor and wherein the second transistor is configured to provide an output current of the second transistor as an M/N scaled estimate of an output current of the first transistor based on the multiplied voltage.

BRIEF DESCRIPTION OF THE DRAWINGS

For proper understanding of the invention, reference should be made to the accompanying drawings, wherein:

FIG. 1 illustrates a Q2 lo-side Metal-Oxide-Semiconductor Field-Effect Transistor (MOSFET) Rdson current sensing circuit for a step down converter;

FIG. 2 illustrates a serial resistor current sensing circuit for a step down converter;

FIG. 3 illustrates a direct current (DC) Resistance (DCR) current sensing circuit for a step down converter;

FIG. 6 illustrates typical transistor Vgs vs Id characteristics;

FIG. 7 illustrates typical transistor Vds vs Id characteristics;

FIG. 8 illustrates typical transistor Id vs Rdson characteristics;

DETAILED DESCRIPTION

Figure 4:
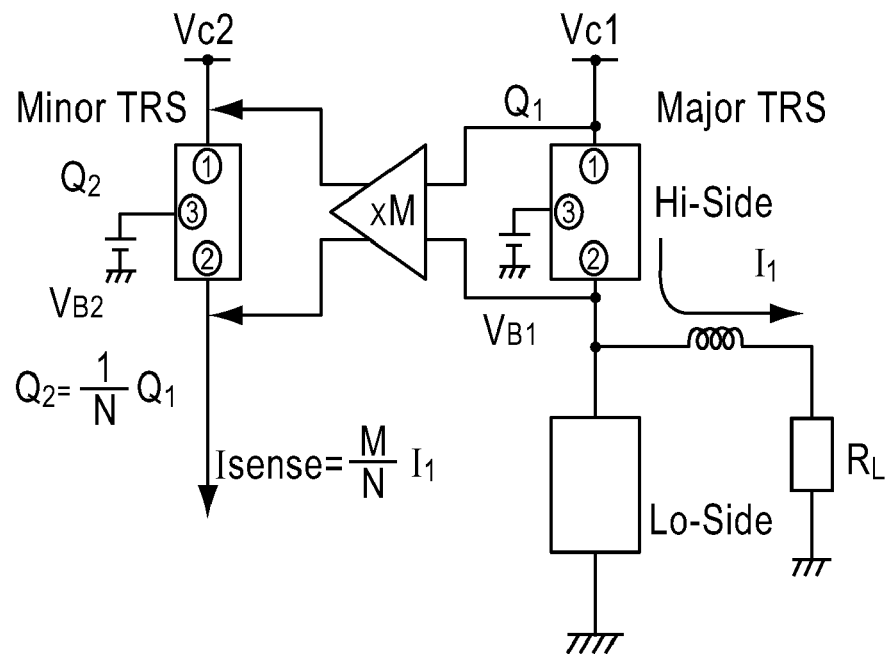
FIG. 4 illustrates an embodiment of the present invention employing a hi-side transistor current sensing method.

Certain embodiments of the present invention can easily and correctly sense a Pulse Width Modulation (PWM) switching load current, although such an application for current sensing is simply an example. Thus, certain embodiments of the present invention may be useful in a current sensing built-in Power System in Package (Power-SiP) for use in a Voltage Regulator (VR), such as a scalable VR. Circuits according to certain embodiments of the present invention may be part of a VR control Integrated Circuit (IC).

Certain embodiments of the present invention can detect a small voltage drop through a hi-side or lo-side MOSFET and amplify this small voltage into a relatively large voltage. The relatively large voltage can then be fed to a very small size MOSFET, which has generally the same structure as the MOSFET of interest, to create a sensing current that is a scaled down version of the output current of the MOSFET of interest.

More particularly, in certain embodiments, the saturation operated hi-side or lo-side transistor (major transistor) saturation voltage of a PWM step-down converter is obtained. This voltage can then be amplified multiple (M) times to feed as a saturation voltage of current sensing minor (1/N times the size of the major) transistor to produce a scaled (M/N) load current as a sensing current.

In a Voltage Regulator (VR) it can be valuable to measure output current for current protection or current sharing for multi-phase operation. There are several ways in which current sensing can be done: (a) Rds on sensing, (b) serial resistor sensing, and (c) DCR sensing, are some examples.

a) Rds on sensing usually measures voltage drop across the output current through turned on lo-side MOSFET. It is referred to as Rds on sensing because it is associated with the effective drain-to-source (ds) resistance of a transistor when in saturation mode (on). Rds on sensing uses a simple circuit. Because of MOSFET Rdson deviation and temperature dependency, it can be hard to measure an exact output current.

FIG. 1 illustrates Rdson sensing including a lo-side MOSFET. When the lo-side MOSFET is on, the output current flows from GND to Q2 to output L to load. The Q2 drain voltage is −RdsonQ2×Iout. Thus, Iout can be sensed with a very simple circuit with no extra power loss. However, the accuracy of this approach is relatively low because of MOSFET Rdson deviation (~+/−20% between batch). Also the accuracy is low because Rdson has temperature dependency) (~+6000 ppm/C.°).

b) Serial resistor sensing is another approach. Serial resistor sensing uses a small value of resistor (~1 mohm) in the current path. In order to achieve such accuracy, one must use a highly accurate, low thermal dependency, and small resistance value resistor, which can be very expensive. Moreover, such an approach (even with a small resistance value resistor) can consume extra power, resulting in power loss under high current operation, such as 20~30 A operation.

Serial resistor sensing is illustrated in FIG. 2. A small value sensing resistor (Rs) is inserted in the current path so as to measure voltage Rs×Iout across the resistor Rs. The sensing accuracy of this approach can be good, but the accuracy depends on the resistor. As noted above, usually a small value (such as ~1 mohm) with a good temperature coefficient is expensive. Additionally, as noted above, such an approach produces extra power loss Rs×Iout^2.

c) DCR sensing is a technique that attempts to balance power loss and accuracy. DCR sensing uses voltage drop of output current in view of the direct current (DC) resistance of a choking coil or inductor. There is no significant extra power loss. Because of DC resistance deviation, temperature dependency, and sensing amplifier input offset, it can, however, be difficult to achieve high accuracy.

DCR sensing is illustrated in FIG. 3. As noted above, the DCR approach uses a stray DC resistance of an output inductor in order to detect the output current. It does not provide significant extra power loss, but it has relatively low accuracy because DCR deviation (~8% between batch) and temperature dependency (+4000 ppm/deg C.). In the DCR approach Rf and Cf are selected such that Rf×Cf=Lx/DCRx. As a result, the sensing current (Isense) is (DCRx/R1)×Iout.

The sensing methods, (a), (b), and (c), discussed above measure output current directly, which can have at least the trade-offs discussed above. Certain embodiments of the present invention avoid such trade-offs, as there is no need to measure the output current directly. Instead, using Integrated Circuit (IC) technology, certain embodiments of the present invention can duplicate scale downed output current. Such a sensing method has essentially no temperature dependency and no device parameter dependencies. Scaling is determined by the amplitude of the resistors' ratio as well as by the transistors size ratio of the major and minor pair.

To measure output current efficiently and accurately, IC circuit technology is useful. To achieve good efficiency, a typical voltage regulator uses a very low Rdson MOSFET, with an Rdson such as 5~10 mohm for hi-side and 1~4 mohm for lo-side MOSFET. Even when output current reaches 20~30 A, the voltage across the on MOSFET is about 20~300 mV. In certain embodiments of the present invention this voltage across the MOSFET is detected and amplified X times, then fed to the same structure, different size (1/N) MOSFET to generate a sensing current (X/N) that is a scale version of the output current.

FIG. 4 illustrates a new hi-side transistor current sensing method. As shown in FIG. 4, Q1 is a step down converter Pulse Width Modulation (PWM) switching hi-side transistor (major transistor). Q2 is a current sensing minor transistor. Q1 and Q2 are fabricated by the same process technology and have the same configuration but are different sizes. The size of Q2 is N times smaller than Q1. Thus Q2 and Q1 can be MOSFETs that have the same gate width and the gate finger length, but number of finger is N times different.

The voltage gain M amplifier amplifies Q1 to provide an output current through a path through corresponding terminals ① and ② when voltage is under saturation operation condition. The amplifier provides the amplified voltage to minor transistor Q2 via corresponding current paths (1) and (2). The voltage is M-times amplified Q1 saturation voltage. The bias voltages VB1 and VB2, set for Q1 and Q2, are at the same saturation level. By measuring the current through the Q2 current path, one can estimate the load current through to Q1.

To reduce power loss and for high efficiency, a large size major transistor can be used. Using a large size major transistor can reduce saturation voltage power loss (Vsat×I1). In an example case, the saturation voltage is tens to low hundreds mV and I1 is several to less than one hundred A. Under such conditions, to avoid parasitic or line impedance voltage drop, the amplifier can detect exact saturation voltage. The saturation voltage can be determined by measuring at major transistor Q1 terminals ① and ②. The measured voltage Vsat(q1) is very small (tens to low hundreds mV), thus it can be amplified M times and provided to minor transistor Q2 terminal ① and ② as a voltage amplified to M×Vsat(q1). Under the same saturation level condition of Q1 and Q2, the current through to Q2 terminal ① to ② is as shown below.

$$Isense=I(q2)=I1\times(M/N)$$

This formula shows that Isense is dependent only on M and N in addition, of course, to the current to be determined As shown in FIG. 4, M is voltage gain of an amplifier. This voltage gain can, in certain embodiments, be decided by a resistor ratio. In other words, a resistor pair can be provided that has a predetermined ratio of resistance. In certain embodiments the ratio itself can be selected rather than the values of the respective resistors. N is the transistor size ratio. The transistor size ratio can be achieved, in certain embodiments, by geometrically proportioning the two transistors in the same semiconductor manufacturing process. Both parameters can be determined in a highly accurate manner. These parameters do not have any significant bias or temperature dependency in their semiconductor process, because the bias and temperature dependency issues are cancelled out through the use of similar devices.

Isense, therefore, in certain embodiments of the present invention is easy to manage to +/−5% accuracy, without trimming. For this operation, VC1 and VC2 can be substantially constant voltages but there is no need for them to be exactly the same voltage.

Figure 5:
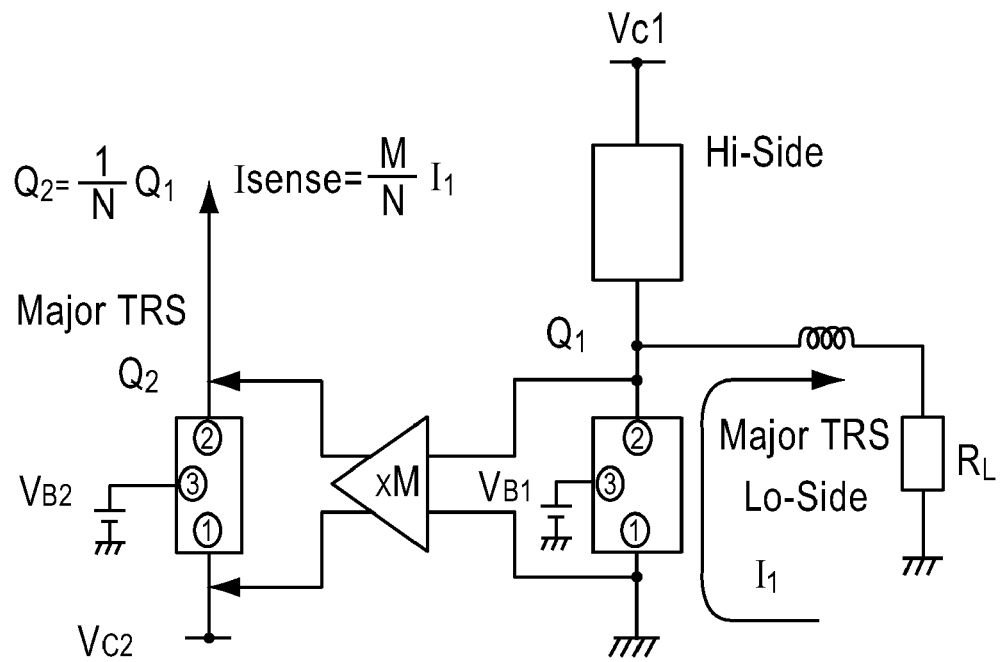
FIG. 5 illustrates an embodiment of the present invention employing a lo-side transistor current sensing method.

FIG. 5 illustrates a lo-side transistor current sensing method, according to certain embodiments of the present invention. In many ways, the method is similar to that of FIG. 4, although the transistor of interest has changed. As shown in FIG. 5, Q1 is a lo-side transistor (major transistor) of a step down converter PWM switching. Q2 is a current sensing minor transistor. Q1 and Q2 can be fabricated by the same process technology and have the same configuration, but can be made to have different sizes. For instance, the size of Q2 may be N times smaller than Q1. The voltage gain amplifier amplifies (M times) the Q1 output current through the path passing through terminal ① and ② voltage under saturation operation condition. For this current flow direction, terminal ② voltage become minus The amplifier provides to the minor transistor Q2, through the current path (1) and (2), the amplified voltage, which is M-times amplified Q1 saturation voltage. The bias voltages VB1 and VB2 set Q1 and Q2 to be at the same saturation level. A measurement of the current through the Q2 current path, can serve as an estimate (according to the appropriate scale) of the load current through to Q1.

FIG. 4 and FIG. 5, as discussed above, show block diagrams of various embodiments of the present invention. As noted above, in FIG. 4, Q1 is the hi-side PWM driver transistor called in that case the major transistor and Q3 is the lo-side PWM driver transistor. In FIG. 5 (lo-side Current Sense), Q1 is the lo-side PWM driver transistor, which is called in that case the major transistor and Q3 is the hi-side PWM driver transistor.

In the embodiments shown in FIGS. 4 and 5, Q1 and Q3 are alternatively ON and OFF to drive the output choking coil (inductor) and load. When Q1 is ON in the embodiment shown in FIG. 4, current flows from Vc1 to transistor terminal ①, to terminal ②, to output choking coil, and finally to load.

When Q1 is ON in the embodiment shown in FIG. 5, current flows from GND, to transistor terminal ①, to terminal ②, to output choking coil, and finally to load. In both FIG. 4 and FIG. 5, VB1 is the bias of Q1 to bias Q1 enough to place it at a saturation level.

When the transistor has the Vgs vs Id characteristics (Vth=2V) shown in FIG. 6, VB1 usually be selected larger than Vth. For example, in certain embodiments Vgs=4.5V~10V. Such a selection ensures that the transistor will be operating in saturation mode.

FIG. 7 illustrates the effect of various Vgs values on the effective resistance of the transistor. The illustration of a transistor working in saturation operation is particularly provided in the left-most, nearly vertical curve. The very steep slope of the curve is representative of the fact that the transistor has a very small effective resistance.

A typical step down converter handles current in a range of about 1~30 A. FIG. 8 shows stable Rdson values at two values of Vgs. In the case of Vgs=10V, the Q1 saturation voltage between terminal 1 to terminal 2, Vsat(q1) is 1.5 mohm×1 A~30 A=1.5 mV~45 mV. This value may be too small for the purposes of current sensing. Accordingly, using amplified magnitudes (×M, M>1), the amplified voltage can be fed in as the saturation voltage of a sensing transistor, called the minor transistor, as Vsat(q2). Q1 and Q2 are fabricated same process technology and same configuration, but differ from one another in physical size. The size of Q2 is N (N>>1) times smaller (i.e. 1/N times larger) than Q1. The bias voltage VB1 and VB2 set Q1 and Q2 to the same saturation level. Thus, Rdson of Q2 is N times larger than Rdson of Q1. Under the same saturation level conditions of Q1 and Q2, the current through Q2 terminal ① to terminal ② is Isense=I(q2)=I1×(M/N) as discussed above.

Figure 9:
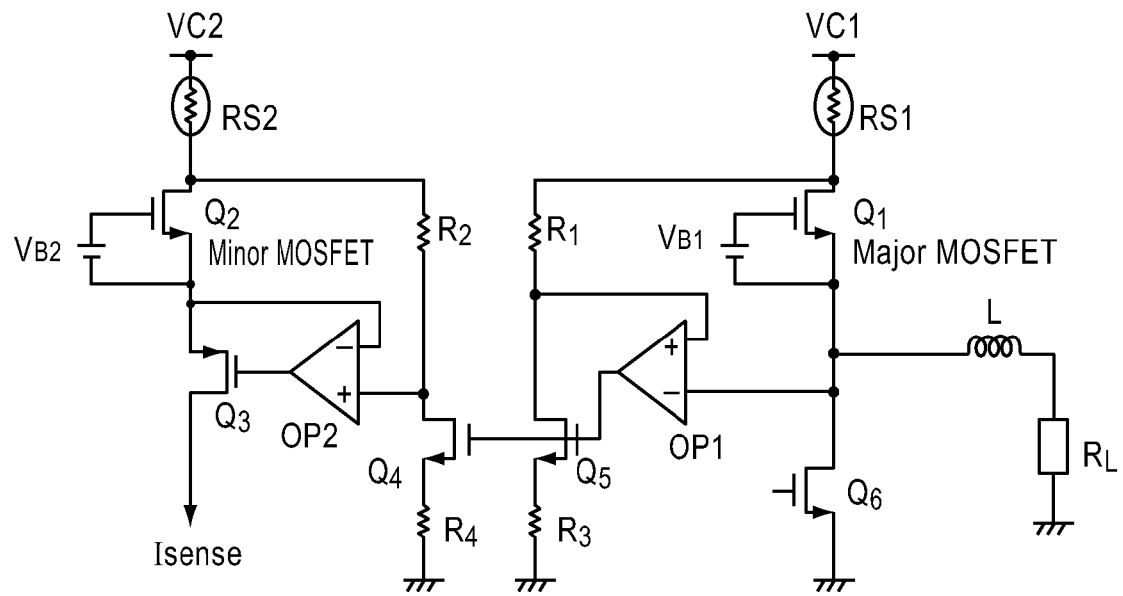
FIG. 9 illustrates a circuit schematic of an embodiment of the present invention.

FIG. 9 illustrates a circuit schematic, in accordance with a first example of an embodiment. FIG. 9 may be one way to embody the higher-level embodiment discussed in FIG. 4. In FIG. 9, VC1 and VC2 are substantially constant voltages. VB1 and VB2 are bias voltage to set Q1 and Q2 to the same saturation level, respectively. Q1 is the hi-side PWM N-ch MOSFET. This is a large size transistor, called a major transistor, which is large enough to drive the current for the output. Q2 is the sensing N-ch MOSFET, called the minor transistor. Q1 and Q2 are fabricated using the same process technology and same configuration, although their physical dimensions may be different. Q2 is N (N>>1) times smaller than Q1. For example, N may be from 10,000 to 20,000 although this should not be viewed as limiting.

In FIG. 9, Q3 is a P-ch MOSFET to pick up sensing current. Q4 and Q5 are N-ch MOSFETs that work as a current mirror. Q6 is the lo-side PWM N-ch MOSFET. RS1 and RS2 are parasitic resistances between drain regions to substantially constant voltages including drain diffusion to a backside die, die attachment to frame and soldering frame to PCB, and the like. R1, R2, R3, and R4 are resistors. OP1 and OP2 are operational amplifiers. L is output choking coil and RL is the load.

When hi-side Q1 is ON and lo-side Q6 is off, current flows from VC1 to RS1. Current continues to flow into Q1 Drain and from there to Q1. From Q1, current flows to source and from there to L. Current then continues to flow into RL and finally to GND. If RL consumes average current Io, the peak current flow through Q1 is described as below.

$$Ipeak(q1) \approx (Vc1-Vo)(Vo/Vc1)(\tfrac{1}{2}Lfsw)+Io$$

Vc1 is the substantially constant voltage provided VC1. Vo is the output voltage across RL, whereas fsw is the switching frequency of Q1 and Q2. When Vc1=12V, Vo=1.2V, L=320 nH, fsw=500 KHz, and Io=25 A, then Ipeak is 28.375 A.

FIG. 8 illustrates a typical N-ch MOSFET case, in which Rdson(q1)=1.5 mohm at Vgs=10V, so the saturation voltage of Q1 (referring again to FIG. 9) under this condition is as shown below.

$$Vsat(q1)=Ipeak(q1)Rdson(q1)=42.56\text{ mV}$$

The sensing resistor R1 can be connected to the topside drain of major MOSFET Q1. The operational amplifier controls the current Idet(r1) through R1 as shown below.

$$Idet(r1)=Vsat(q1)/R1$$

Idet(r1) is sunk by Q5 drain and flows to Q5 source, from there to R3 and finally to GND. Q5 and Q4 have the same bias voltage, so Q5 and Q4 serve as a current mirror circuit. Q4 is of a size that is Y times larger than Q5 and R3 is Y times larger than R4, the current gain of this current mirror is Y. The current through to R2 mean Idet(r2) is described below.

$$Idet(r2)=YIdet(r1)$$

R2 connects the minor MOSFET Q2 drain and operational amplifier OP2. Meanwhile, P-ch MOSFET Q3 helps set Q2 drain to source voltage as shown below.

$$Vds(q2)=R2Idet(r2)=R2YIdet(r1)=YVsat(q1)(R2/R1)$$
$$=MVsat(q1)$$

wherein M=Y(R2/R1) represents voltage gain that consists of a current mirror and resistors, and VB2 is selected to set minor MOSFET Q2 to the same saturation level as Q1. Thus, when the size of Q2 is N times smaller than Q1, Rdson (q2) is N times larger than Rdson(q1). For this reason, Isense current flow through Q2 is as shown below.

$$Isense=Vds(q2)/Rdson(q2)=Vsat(q2)/Rdson(q2)=MVsat(q1)/Rdson(q2)$$

wherein Vsat(q1)=Ipeak(q1)Rdson(q1) and wherein Isense=Ipeak(q1) M (Rdson(q1)/Rdson(q2))=Ipeak(q1) M/N.

The current Isense flows from VC2 to RS2. From RS2 the current flows to Q2 drain and from there to Q2 source. From thence, the current flows to Q3 source and finally to the Monitor Circuit. The variable M is the voltage gain, which is determined by resistor pairs R1,R2 and R3,R4 and MOSFET size ratio Q4:Q5. Thus, one can provide a highly accurate value in IC process without temperature or operation conditions substantially affecting the accuracy. The variable N is the major MOSFET Q1 and minor MOSFET Q2 size ratio, so that can be kept highly accurate as well.

Of course, many circuit variations are permitted within the scope of the invention. VC1 and VC2 may be permitted to use same voltage. Different current mirror circuit or voltage gain circuits may be used. R2 may be permitted to connect to the VC2 line when Isense current is enough to small (Vsat(q2)>>Isense RS2). Also when system required accuracy allows, R1 may be able to be connected to VC1.

Figure 10:
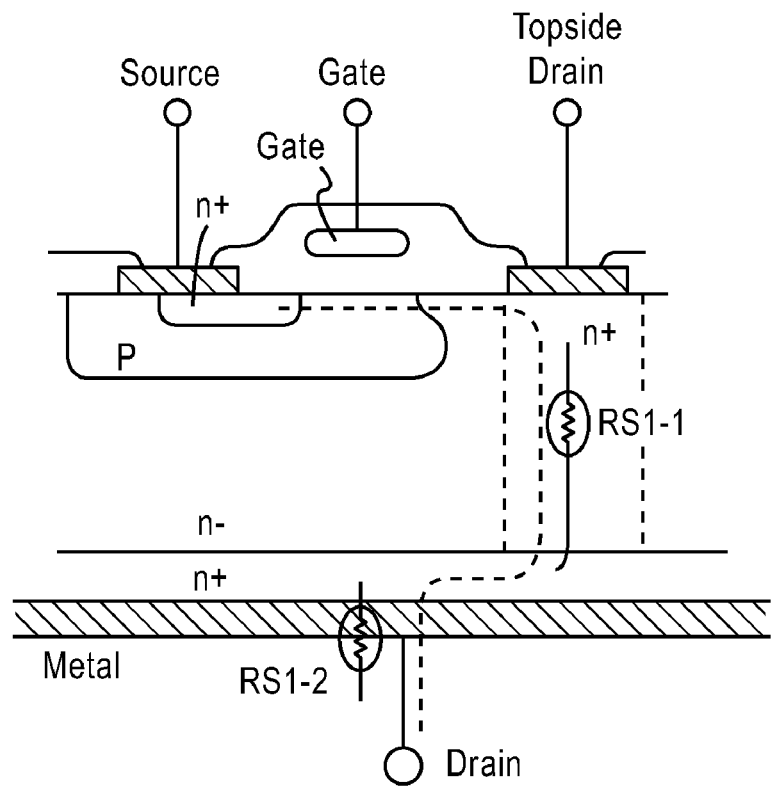
FIG. 10 illustrates an example planar vertical structure, according to an embodiment of the present invention.

FIG. 10 illustrates a planar vertical structure according to certain embodiments of the present invention. As can be seen in FIG. 10, it may be possible to use a topside drain to provide the voltage from the drain of a transistor. The topside drain can eliminate the additional resistances Rs1-1 and Rs1-2 and consequently help to measure very high accurate drain to source saturation voltage.

Figure 11:
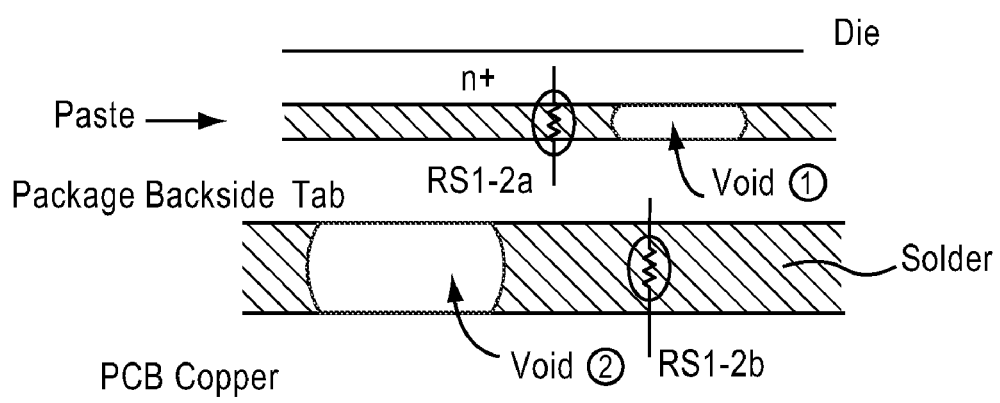
FIG. 11 illustrates voids in a drain current path.

FIG. 11 illustrates voids in a drain current path, which can lead to varying saturation voltage in a package. As can be seen from FIG. 11, it is possible for voids to exist between the source and the backside drain. Such voids make it more difficult to keep the Rdson consistent between two similar transistors, since Rdson is quite small. Accordingly, the use of a top-side drain, such as that shown in FIG. 10 may be useful to improve consistency and improve accuracy in the sensing current's relation to the current to be estimated.

Figure 12:
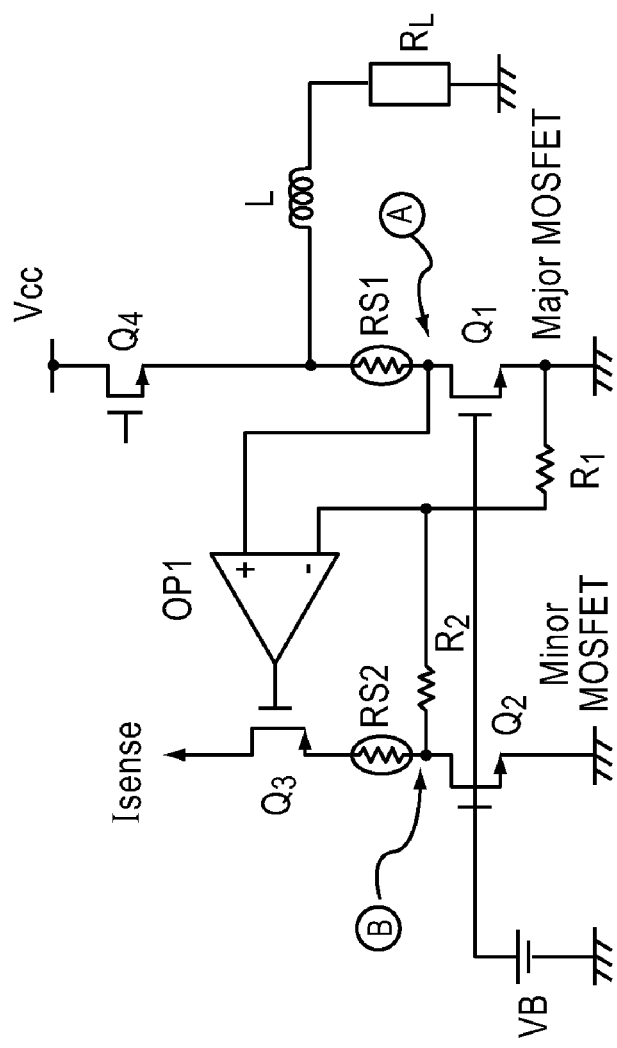
FIG. 12 illustrates a circuit schematic of an embodiment of the present invention.

FIG. 12 illustrates a circuit schematic, in accordance with a second example of an embodiment. In FIG. 12, Q1 is the lo-side PWM N-ch MOSFET. Q2 is the sensing N-ch MOSFET, called the minor transistor. Q3 is a P-ch MOSFET to pick up sensing current. OP1 is an operational amplifier. RS1 and RS2 are parasitic resistances between drain regions to substantially constant voltages including drain diffusion to a backside die, die attachment to frame and soldering frame to PCB, and the like. R1 and R2 are a resistor pair. The resistor pair has a predetermined ratio, M. M can be selected to be, for example, in this case, from 3 to 10. Both Q1 and Q2 in this example can be connected to ground.

Figure 13:
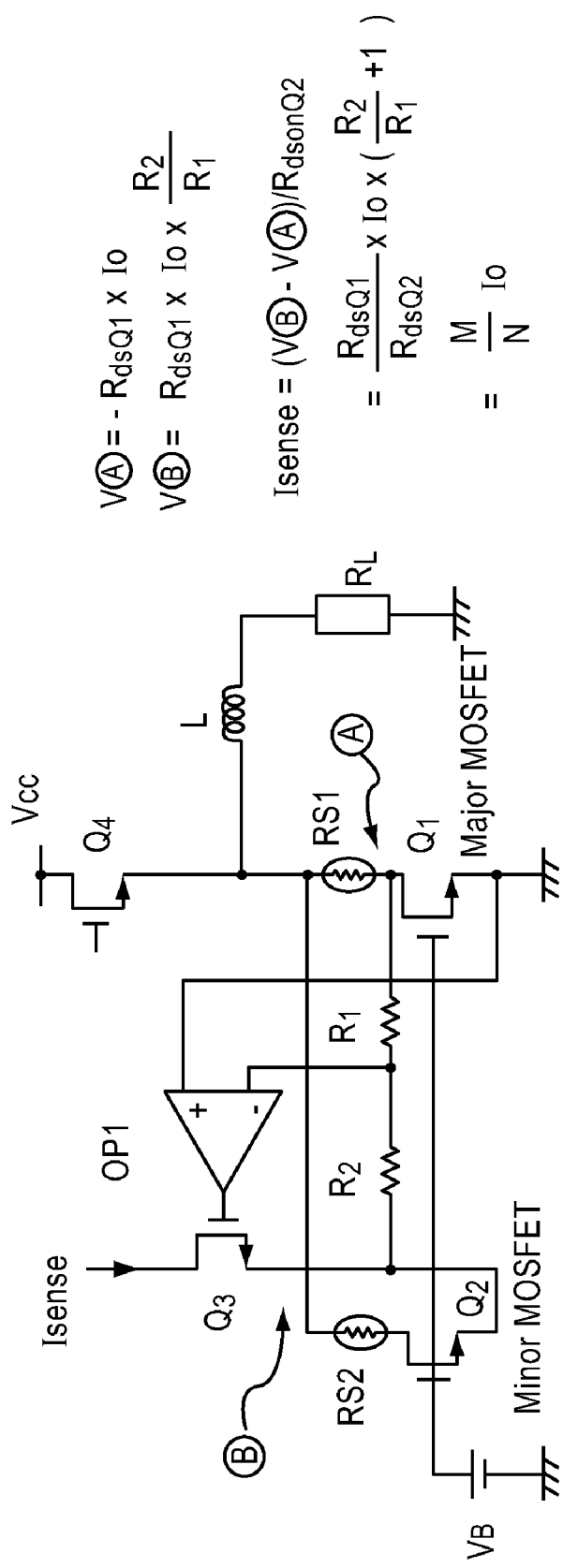
FIG. 13 illustrates a circuit schematic of an alternative embodiment of the present invention.

FIG. 13 illustrates a circuit schematic, in accordance with a third example of an embodiment. In FIG. 13, Q1 is the lo-side PWM N-ch MOSFET. Q2 is the sensing N-ch MOSFET, called the minor transistor. Q3 is an N-ch MOSFET to pick up sensing current. OP1 is an operational amplifier. RS1 and RS2 are parasitic resistances between drain regions to switching node voltages including drain diffusion to a backside die, die attachment to frame and soldering frame to PCB, and the like. R1 and R2 are a resistor pair. In this case it is not necessary to connect Q2 to ground.

Figure 14:
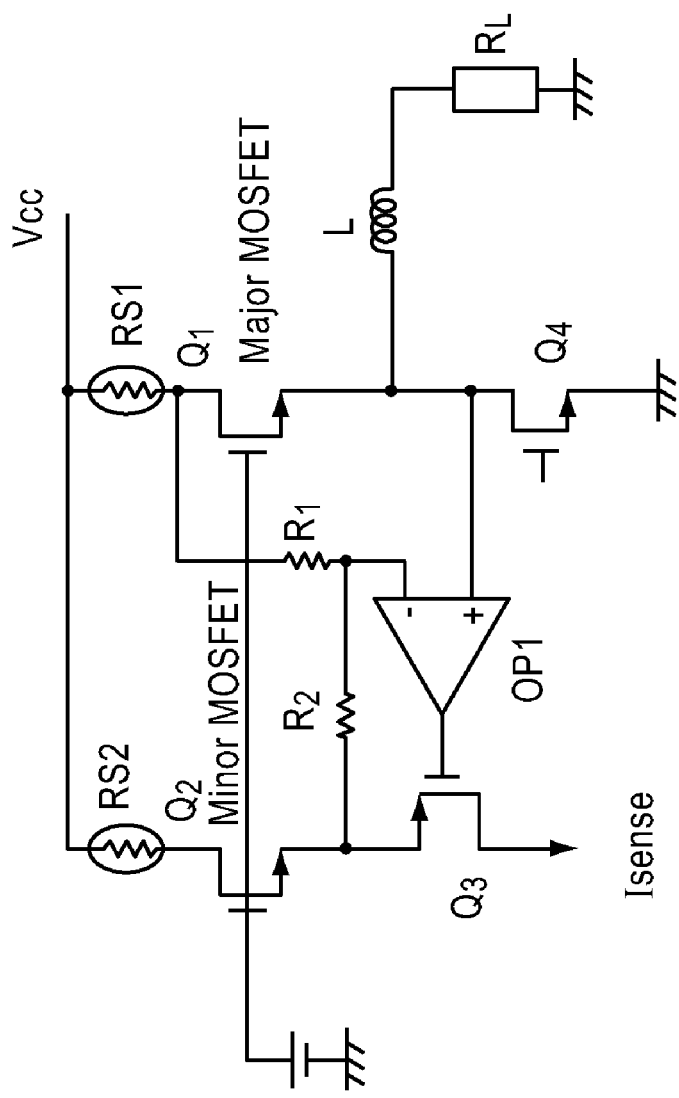
FIG. 14 illustrates a circuit schematic of an alternative embodiment of the present invention.

FIG. 14 illustrates a circuit schematic, in accordance with a fourth example of an embodiment. In FIG. 14, Q1 is the hi-side PWM N-ch MOSFET. Q2 is the sensing N-ch MOSFET, called the minor transistor. Q3 is a P-ch MOSFET to pick up sensing current. OP1 is an operational amplifier. RS1 and RS2 are parasitic resistances between drain regions to substantially constant voltages including drain diffusion to a backside die, die attachment to frame and soldering frame to PCB, and the like. R1 and R2 are a resistor pair. FIG. 14 may be considered to be a similar approach to the approach shown in FIG. 12, but adapted to measuring the Hi-side PWM N-ch MOSFET.

Figure 15:
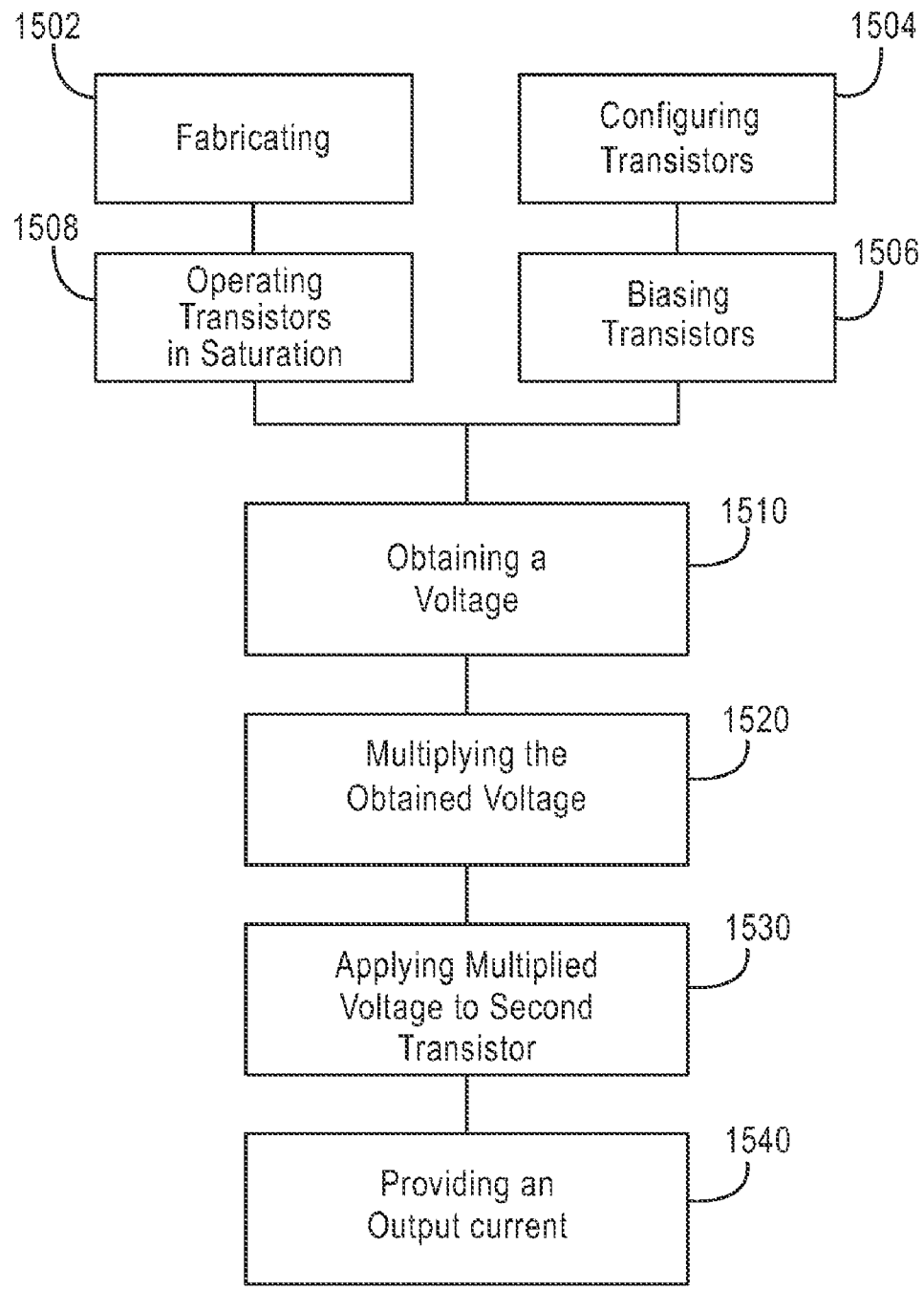
FIG. 15 illustrates a method according to an embodiment of the present invention.

FIG. 15 illustrates a method, according to the present invention. As shown in FIG. 15, the method can include obtaining 1510 a voltage across a first transistor as an obtained voltage. The method can also include multiplying 1520 the obtained voltage by a predetermined multiple M to yield a multiplied voltage. The method can further include applying 1530 the multiplied voltage to a second transistor, wherein the second transistor is N times smaller than the first transistor. The method can additionally include providing 1540 an output current of the second transistor as an M/N scaled estimate of an output current of the first transistor.

In certain embodiments the method also includes fabricating 1502 the first transistor and the second transistor by the same process technology. Similarly, certain embodiments include configuring 1504 the first transistor and the second transistor identically. The first transistor and the second transistor can be MOSFETs which have same gate width and gate finger length, but number of finger is N times different.

The first transistor can be a planar vertical MOSFET with a topside drain voltage monitor and a backside main drain. In such an instance, the obtaining 1510 a voltage can include obtaining the voltage between the topside source and the topside drain.

The method can additionally include biasing 1506 the first transistor and the second transistor with almost the same Vgs. Likewise, the method can include operating 1508 the first transistor and the second transistor in saturation mode.

In certain embodiments, in a PWM step down converter, a measurement is made of the saturation operated hi-side or lo-side transistor (major transistor) saturation voltage. That voltage is amplified (×M>1) times to feed as a saturation voltage of current sensing minor size (×1/N than major, N>>1) transistor to produce (×M/N) scaled output current as a sensing current. The major and minor transistors can be fabricated by the same process technology and can have the same identical configurations. Both the major and the minor transistors can be biased to almost same saturation level.

The major transistor can be hi-side and its structure can be planar vertical MOSFET. The major transistor can have a topside drain voltage monitor terminal but backside main drain. The amplifier can detect the voltage between the topside Source and the topside drain as a saturation voltage.

Alternatively, the major transistor can be a lo-side MOSFET. The amplifier (+) input can be connected to the major transistor source and the amplifier (−) input can be connected to the major transistor drain. The amplifier can work as an inverted amplifier (×M>1) times to feed as a saturation voltage of current sensing minor size (×1/N than major, N>>1) transistor to produce a scaled (×M/N) output current as a sensing current.

In certain embodiments, the major and minor transistors may be MOSFETs and when it is an appropriate time to monitor, both MOSFETs are biased by almost the same Vgs (for example, ordinary copper losses between the two gates would mean that both MOSFETs were biased by almost the same Vgs). The Vgs can be larger than Vth to set MOSFETs to same saturation level.

In other embodiments, the inductive load PWM driver measures the saturation operated hi-side or lo-side transistor (major transistor) saturation voltage. The saturation voltage is amplified (×M>1) times. The amplified voltage can be fed as a saturation voltage for the current sensing minor size (×1/N than major, N>>1) transistor. The amplified voltage fed to the minor transistor can produce a scaled (×M/N) output current as a sensing current. The major and minor transistor can be fabricated by the same process technology, can have the same configuration, and can both be biased to almost the same saturation level.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

We claim:

1. A method, comprising:
   obtaining a voltage across a source and drain of an activated first transistor;
   multiplying the obtained voltage by a predetermined multiple M to yield a multiplied voltage;
   applying the multiplied voltage across a source and drain of an activated second transistor, wherein a resistance between the source and drain of the activated second transistor is N times greater than a resistance between the source and drain of the activated first transistor; and
   providing an output current of the second transistor as an M/N scaled estimate of an output current of the first transistor.

2. The method of claim 1, further comprising:
   fabricating the first transistor and the second transistor by the same process technology.

3. The method of claim 1, further comprising:
configuring the first transistor and the second transistor identically.

4. The method of claim 1, wherein the first transistor is a planar vertical MOSFET with a topside drain voltage monitor and a backside main drain.

5. The method of claim 1, further comprising:
biasing the first transistor and the second transistor with almost the same gate to source voltage.

6. The method of claim 1, further comprising:
operating the first transistor and the second transistor in saturation mode.

7. The method of claim 1, wherein the first transistor is a hi-side transistor of a pulse width modulation step down converter.

8. The method of claim 1, wherein the first transistor is a lo-side transistor of a pulse width modulation step down converter.

9. An apparatus, comprising:
a voltage amplifier configured to obtain a voltage across a source and drain of an activated first transistor and multiply the obtained voltage by a predetermined multiple M to yield a multiplied voltage; and
a second transistor, wherein a resistance between a source and drain of the activated second transistor is N times greater than a resistance between the source and drain of the activated first transistor and wherein the voltage amplifier is coupled to provide the multiplied voltage across the source and drain of the second transistor, and wherein the second transistor is configured to generate an output current that is an M/N scaled estimate of an output current of the first transistor based on the multiplied voltage.

10. The apparatus of claim 9, wherein the first transistor and the second transistor are fabricated by the same process technology.

11. The apparatus of claim 9, wherein the first transistor and the second transistor are identically configured.

12. The apparatus of claim 9, wherein the first transistor is a planar vertical MOSFET with a topside drain voltage monitor and a backside main drain.

13. The apparatus of claim 9, wherein the first transistor and the second transistor are configured to be biased with almost the same gate to source voltage.

14. The apparatus of claim 9, wherein the first transistor and the second transistor are both configured to be operated in saturation mode.

15. The apparatus of claim 9, wherein the first transistor is a hi-side transistor of a pulse width modulation step down converter.

16. The apparatus of claim 9, wherein the first transistor is a lo-side transistor of a pulse width modulation step down converter.

* * * * *